United States Patent [19]

Early et al.

[11] Patent Number: 4,540,900
[45] Date of Patent: Sep. 10, 1985

[54] REDUCED SWING LATCH CIRCUIT UTILIZING GATE CURRENT PROPORTIONAL TO TEMPERATURE

[75] Inventors: Adrian B. Early; William J. Lillis, both of Tucson, Ariz.

[73] Assignee: Burr-Brown Corporation, Tucson, Ariz.

[21] Appl. No.: 394,487

[22] Filed: Jul. 1, 1982

[51] Int. Cl.³ .................... H03K 19/08; H03K 3/286
[52] U.S. Cl. .................................. 307/289; 307/467; 307/455; 307/299 A; 307/310
[58] Field of Search ............ 307/455, 463, 467, 475, 307/246, 299 A, 310, 291, 277 R, 289, 491

[56] References Cited

U.S. PATENT DOCUMENTS

| 3,917,959 | 11/1975 | Swiatowiec et al. | 377/107 |
| 4,041,326 | 8/1977 | Robinson | 307/299 A |
| 4,145,623 | 3/1979 | Doucette | 307/467 |
| 4,167,727 | 9/1979 | Anderson et al. | 307/467 |
| 4,276,488 | 6/1981 | Benedict et al. | 307/455 |
| 4,359,647 | 11/1982 | Trinkl | 307/299 A |
| 4,385,370 | 5/1983 | Isogai | 307/467 |
| 4,408,134 | 10/1983 | Allen | 307/455 |
| 4,435,654 | 3/1984 | Koide | 307/455 |

OTHER PUBLICATIONS

"Emitter Function Logic—Logic Family for LSI", by Skokan, *IEEE Journal of Solid State Circuits*, vol. SC-8, No. 5, Oct. 1973, pp. 356-361.
"High Speed Current Mode Logic for LSI", by Cooperman, *IEEE Transactions on Circuits and Systems*, vol. CAS/27, No. 7, Jul. 1980, pp. 626-635.

*Primary Examiner*—Stanley D. Miller
*Assistant Examiner*—Timothy P. Callahan
*Attorney, Agent, or Firm*—Cahill, Sutton & Thomas

[57] ABSTRACT

A latch circuit utilizes a series-gated, emitter coupled logic structure including a current source providing a gate current substantially proportional to temperature for developing an output signal swing substantially proportional to temperature, thereby allowing the output signal swing to have a reduced magnitude at nominal temperatures. The load across which the output signal is developed includes a resistor coupled in series with a semiconductor P-N junction. Emitter areas of emitter-coupled transistor pairs within the latch circuit are mismatched for creating an offset tending to compensate changes in the voltage across the semiconductor junction within the load resulting from the switching action of the latch circuit. A bias circuit maintains the switching threshold reference voltage substantially intermediate the output signal swing. The semiconductor junction within the load of the latch circuit may correspond with the base-emitter junction of a transistor, and an additional load resistor may be coupled to the collector thereof for providing a second output signal swing of increased magnitude isolated from the feedback path of the latch circuit. In an alternate embodiment, the semiconductor junction within the load is eliminated, and a follower transistor is inserted within the feedback path of the latch circuit for level-shifting the output signal voltage developed across the load resistor and providing a low impedance source thereof.

12 Claims, 5 Drawing Figures

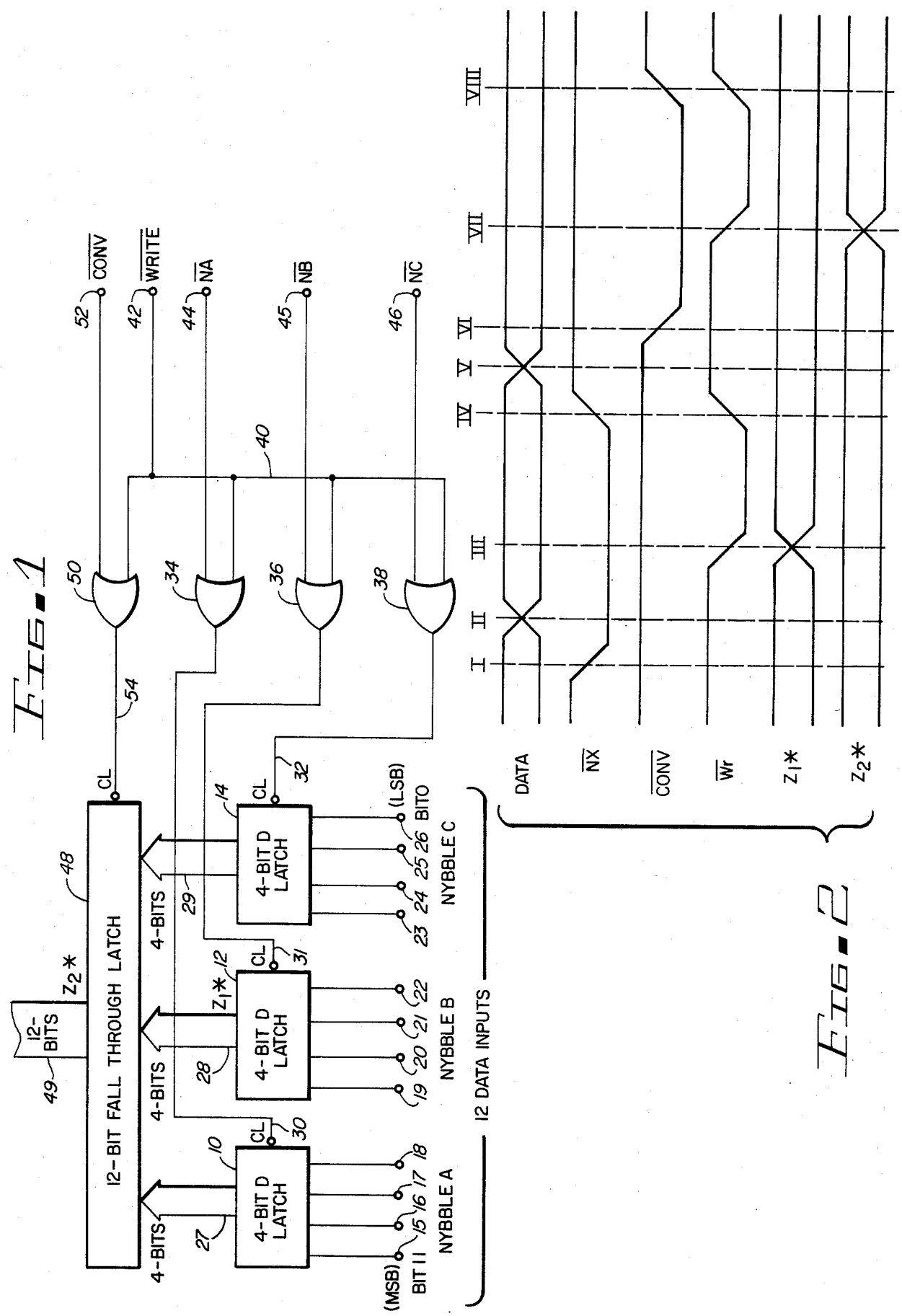

REDUCED SWING LATCH CIRCUIT UTILIZING GATE CURRENT PROPORTIONAL TO TEMPERATURE

BACKGROUND OF THE INVENTION

1. Field of the Invention

The present invention relates generally to digital logic circuitry, and more particularly, to a high-speed digital latch circuit using emitter-coupled logic circuitry and developing an output signal swing having a magnitude substantially proportional to temperature.

2. Description of the Prior Art

Digital-to-analog converter circuits are known in the art for converting a multiple bit digital input signal to a corresponding analog voltage. High speed digital-to-analog converter circuits fabricated upon monolithic substrates using bipolar transistor integrated circuit technology are widely available. However, such monolithic high speed digital-to-analog converters usually lack any means for storing the digital input signal to be processed by the converter. To avoid slowing the response time of the converter, such a storage means must necessarily have fast switching speeds. In addition, such a storage means must be relatively compact to avoid significant increases in the size of the monolithic substrate upon which the converter is fabricated and to avoid corresponding decreases in the production yields of such converters.

Since the digital input signal presented to such a converter is often generated by TTL-type logic circuitry, implementation of such a storage means using TTL circuitry would be an obvious alternative; in this manner the storage means would be input compatible with the source of the digital input signal. However, conventional TTL circuitry is typically slower than the bipolar converter circuitry and would therefore result in unacceptable signal delays. While techniques such as gold-doping of transistors and the use of Schottky diodes are known for increasing the speed of conventional TTL circuitry, such techniques are generally incompatible with the processing methods used to produce high-speed digital-to-analog converter circuits. Furthermore, the relatively large number of transistors needed to implement a TTL clocked data latch would significantly increase the size of the substrate upon which the converter is fabricated, particularly when the number of bits within the digital input signal, and hence the number of such latch circuits, is relatively large.

As an alternative to the use of TTL circuitry to form clocked data latches upon the converter substrate, relatively high-speed emitter-coupled logic structures, known to the art and employing series-gating techniques, might be used to form such clocked data latches. For example, emitter-function logic structures forming a gated latch and a clocked D-type flip-flop are illustrated in "Emitter Function Logic-Locig Family For LSI", by Skokan, *IEEE Journal of Solid State Circuits*, Vo. SC-8, No. 5, October, 1973, pages 356–361. A latch circuit and a master/slave flip-flop circuit utilizing current mode logic are illustrated in "High Speed Current Mode Logic For LSI", by Cooperman, *IEEE Transactions on Circuits and Systems*, Vol. CAS-27, No. 7, July, 1980, pages 626–635. Such emitter-coupled logic structures are generally compatible with the processing methods used to form high speed converter circuits and have sufficient switching speeds to avoid significant delays in the presentation of the digital input signal to the converter.

Typically, such emitter-coupled, series-gated latch circuits include an upper-level bias transistor having a base terminal coupled to a threshold or reference voltage and a collector terminal coupled by a load resistor to the positive-most power supply (usually ground potential). The bias transistor is emitter coupled to an input transistor having a base terminal which receives an input signal which switches between a high level of approximately ground voltage and a low level of approximately 0.8 volts below ground potential. The gate current and load resistor are typically selected to create a voltage swing of approximately 0.8 volts across the load resistance. The reference voltage is selected to be midway between the input signal swing, or approximately at 0.4 volts below ground potential. In order to latch the input data, a second emitter-coupled pair of transistors is provided. The second emitter-coupled transistor pair is often formed by fabricating the above-mentioned bias transistor as a double-emitter device and coupling the second such emitter to the emitter terminal of a feedback transistor. The base terminal of the feedback transistor is coupled to the collector of the bias transistor, and thus, the feedback portion of the latch is driven by a so-called single-ended feedback signal. A clocked, lower-level emitter-coupled gate switches gate current between the input and feedback emitter-coupled transistor pairs within the upper level of the gate structure for selectively switching the latch structure between an acquire mode and a latch mode for initially acquiring the data presented at the latch input and subsequently latching the same within the feedback stage, respectively.

Emitter-coupled latch circuits of the general type described above are subject to various limitations which somewhat restrict their performance. For example, the gate current within such series gated structures typically decreases with increasing temperature. Accordingly, the logic swing developed across the load resistor in such latch circuits decreases in magnitude with increasing temperatures. In contrast, the voltage differential which must necessarily be applied to the base terminals of an emitter coupled transistor pair to enture a given ratio between the current conducted by the on transistor and the current conducted by the off transistor actually increases with increasing temperatures. Consequently, such circuitry is typically designed so as to maintain at least a predetermined voltage swing at relatively high temperatures to assure a sufficient ratio of on current to off current at such temperatures. The result is that, at nominal temperatures, the voltage swing across the load resistor is actually much larger than is actually needed to maintain the same ratio of on current to off current within the emitter-coupled transistor pair. However, the relatively large swing at nominal temperatures results in the switching time of the latch being increased over that which could be obtained were a smaller voltage swing utilized.

Furthermore, the maximum temperature at which such circuitry may be operated without adversely affecting switching speed is limited by saturation of the base-collector junction of the bias transistor. When the bias transistor is turned on, the voltage at its collector may be 0.8 volts or more below ground potential, while its base is approximately 0.4 volts below ground. Consequently, the bias transistor base-collector junction is forward biased by 0.4 volts or more. When parasitic resistances within the transistor itself are accounted for, the actual forward bias across the base-collector junction of the transistor is even larger. At sufficiently high temperatures, the bias transistor begins operating in a saturated mode, thereby causing switching speed to slow down.

A further limitation of such prior art emitter-coupled latch circuits regards minimum edge speeds of clocking signals used to switch the latch circuit from the acquire mode to the latched mode. Depending upon the nature of the circuit and the edge speed of the clocking signal, a low voltage established at the collector of the bias transistor during the acquire mode may begin to rise toward ground potential before the lower level clock gate switches sufficient current to the feedback stage of the latch circuit to reestablish the low output level. In this case, the data acquired during the acquire mode may be lost before the latch circuit has completely switched to the latched mode of operation.

Yet another limitation of such prior art emitter-coupled latch circuits is the relative difficulty involved in interfacing the input portions of such circuits to other digital logic families, such as transistor-transistor logic (TTL). The threshold or reference voltage applied to the bias transistor within the upper level of such latch circuits is typically only 0.4 volts below the positive-most voltage supply. Such emitter-coupled circuits necessarily have difficulty responding to input signals of the type provided by TTL circuitry.

Similarly, it is often difficult to interface the output of such prior art latch circuits with the input portion of other types of digital logic because of the relatively small magnitude of the output signal swing as well as the need to reference the output signal relative to ground potential (or other positive supply voltage). For similar reasons, such emitter-coupled latch circuits are not well adapted to drive the input switching stages of high-speed digital-to-analog converters.

Finally, such prior art emitter-coupled latch structures have limited fan-out, i.e., the capability to drive other gates that are of the same type logic family. For example, the EFL type latch circuit described by Skokan requires an additional emitter diffusion within the output transistor for each additional gate to be driven thereby. The CML latch circuit disclosed by Cooperman has rather limited output drive capability unless the size of the load resistor is decreased which, in turn, increases the gate current and overall power consumed.

Accordingly, it is an object of the present invention to provide a clocked data latch circuit compatible with the fabrication methods and operating speeds of a high speed monolithic digital-to-analog converter and capable of being formed on the same substrate therewith as a relatively compact structure.

It is another object of the present invention to provide a high speed latch circuit utilizing emitter-coupled transistor switches wherein the magnitude of the nominal output voltage swing provided thereby is sufficiently large to maintain an adequate ratio of on-current to off-current within the feedback portion thereof without being so large as to unnecessarily increase the switching speed of the latch circuit.

It is a further object of the present invention to provide an emitter-coupled latch circuit wherein the magnitude of the output voltage swing increases proportionally with increased temperature for maintaining a predetermined ratio of on-current to off-current in similar circuits driven thereby despite changes in temperature.

It is still another object of the present invention to provide such an emitter-coupled latch circuit which may be operated at relatively high temperatures without adversely affecting the speed thereof.

It is yet another object of the present invention to provide such an emitter-coupled latch circuit wherein the tendency of the latch circuit to lose the state of the acquired data when being switched to the latched mode of operation is reduced.

It is a further object of the present invention to provide such an emitter-coupled latch circuit which is input capatible with TTL circuitry as well as other logic families.

It is a still further object of the present invention to provide such an emitter-coupled latch circuit which can provide an output signal having a voltage swing largely in excess of that used to retain the state of the data within the feedback stage of the latch circuit itself, to more easily drive other types of switching circuitry.

It is yet a further object of the present invention to provide such an emitter-coupled latch circuit wherein the fan-out capability of the latch circuit may be greatly increased with a minimum of extra components and power.

It is yet another object of the present invention to provide a bias circuit for such an emitter-coupled latch circuit wherein the threshold level, or reference voltage, tracks with the output signal swing over changes in temperature so as to remain substantially centered within the output voltage swing.

These and other objects of the present invention will become more apparent to those skilled in the art as the description thereof proceeds.

SUMMARY OF THE INVENTION

Briefly described, and in accordance with one embodiment thereof, the present invention relates to a latch circuit including an emitter-coupled, series-gated structure including a gate current source providing a regulated gate current having a magnitude substantially proportional to temperature, as well as a resistive load for developing an output signal swing that is substantially proportional to temperature. A double-emitter bias transistor has a first emitter coupled to the emitter of an input transistor and has a second emitter coupled to the emitter of a feedback transistor. The base terminal of the input transistor receives the input data signal, either directly or by way of an input buffer circuit. The base terminal of the bias transistor is coupled to a first reference voltage generated by an associated bias circuit. The base terminal of the feedback transistor is coupled to the collector terminal of the bias transistor for latching the state of the data acquired during the acquire mode of operation. An emitter-coupled transistor pair, i.e., a current steering circuit, selectively couples the gate current source to either the first or second emitter terminals of the bias transistor for switching the latch circuit between its acquire and latched modes of operation. The load is coupled between the collector of the bias transistor and a second reference voltage generated by the bias circuit, which second reference voltage may be selected within a wide range of nominal voltages.

In one preferred embodiment of the present invention, the latch circuit load is formed by a semiconductor P-N junction coupled in series with a load resistor between the collector of the bias transistor and the aforementioned second reference voltage generated by the bias circuit. While the semiconductor P-N junction within the load may be a diode, the semiconductor P-N junction is preferably formed by the base-emitter junction of a load transistor in order to minimize current drain from the bias circuitry which generates the second reference voltage. While the gate current and load resistor are chosen to provide a nominal output swing of approximately 300 millivolts, a larger valued resistor may be inserted between the collector of the load transistor and the positive-most voltage supply conductor for generating a second output signal isolated from the feedback portion of the latch circuit, which second output signal may have a nominal magnitude largely in excess of the 300 millivolt nominal swing within the latch itself. The second output signal may then be conveniently used to drive other types of switching circuitry requiring larger input signal swings.

Utilization of a semiconductor P-N junction within the load of the latch circuit as described above results in a portion of the output signal swing being caused by changes in the voltage across the junction due to changes in current conducted by the load. Such shifts in the junction voltage tend to create an offset in the switching characteristics of the feedback portion of the latch circuit. Partial or complete compensation of this offset may be achieved by making the emitter regions of the first and second emitters of the bias transistor larger in area than the emitter regions of the input transistor and feedback transistor coupled in common therewith. Furthermore, increasing the sizes of the emitters within the bias transistor correspondingly increases the overall size of the bias transistor and reduces parasitic collector resistances associated therewith; accordingly, voltage drops across parasitic resistance components of the bias transistor tending to forward bias the collector-base junction thereof are reduced. In addition, the larger overall size of the bias transistor causes the parasitic capacitances associated therewith to be increased somewhat, allowing the latch circuit to retain the state of the data for a longer period of time during switching between the acquire mode and the latched mode.

In the preferred embodiment of the present invention, the bias circuit associated with the latch circuit includes a bias resistor and a P-N semiconductor junction coupled in series between a first terminal at which the first reference voltage is provided and a second reference terminal at which the second reference voltage is provided. The bias circuit further includes a current source similar to the one incorporated within the latch circuit for causing a temperature porportional current to flow within the aforementioned bias resistor and semiconductor P-N junction within the bias circuit. By selecting the magnitude of the bias resistor to be one-half that of the latch circuit load resistor, the voltage drop across the bias resistor is maintained at exactly one-half of the voltage drop across the latch circuit load resistor when the bias transistor is conductive. Since the first reference voltage and the latch circuit output signal are both referenced to the second reference voltage, any changes in the second reference voltage induced by changes in temperature affect the first reference voltage and latch circuit output signal equally. Accordingly, the first reference voltage is maintained relatively centered within the latch circuit output voltage signal swing despite variations in temperature. The actual nominal voltage level of the second reference voltage may be selected from a relatively wide range of voltages to allow the input of the latch circuit to be compatible with a variety of other logic families.

In a high fan-out embodiment of the present invention, the semiconductor P-N junction is eliminated from within the load of the latch circuit, and the load resistor is directly coupled between the collector of the bias transistor and the second reference voltage. The high fan-out embodiment instead includes a follower transistor having its base terminal coupled to the collector of the bias transistor and having its emitter terminal coupled to the base of the feedback transistor. The emitter of the follower transistor serves as a low impedance source of the latch output signal which may be used to drive a relatively large number of input stages for similar circuits.

BRIEF DESCRIPTION OF THE DRAWINGS

FIG. 1 is a block diagram of a dual stage 12-bit data latch wherein the twelve input data bits may be separately latched in groups of four bits.

FIG. 2 is a timing diagram illustrating waveforms corresponding to the input data signal, clocking signals, and latch output signals for the latch circuitry represented within FIG. 1.

DETAILED DESCRIPTION OF THE PREFERRED EMBODIMENTS

Figure 3:
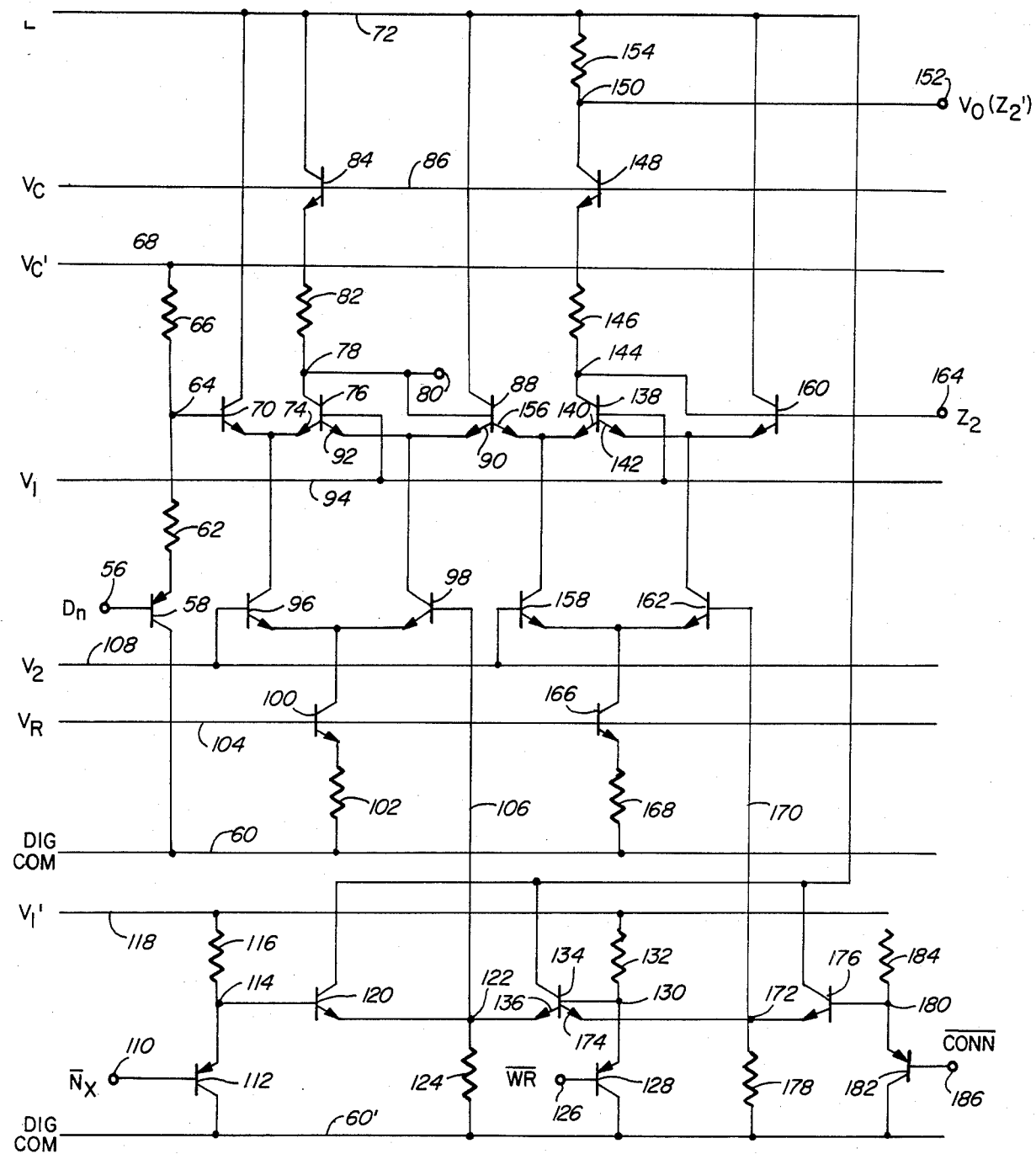
FIG. 3 is a circuit schematic of an emitter-coupled, series gated latch circuit corresponding to a one-bit slice of the circuitry represented within FIG. 1.

FIG. 1 shows a 12-bit, dual stage latch circuit of the general type which may be constructed according to the teachings of the present invention. The first, or input, stage of the dual stage latch shown in FIG. 1 is partitioned into three 4-bit D latches 10, 12 and 14. Each of latches 10, 12 and 14 includes four input terminals for receiving a 4-bit portion (or nybble) of a 12-bit data input word. Latch 10 includes input terminals 15, 16, 17 and 18 for receiving nybble A, the four most significant bits of the input data word. Latch 12 includes input terminals 19, 20, 21 and 22 for receiving nybble B, or the middle four bits of the input data word. Similarly, latch 14 includes input terminals 23, 24, 25 and 26 for receiving nybble C, or the least significant four bits of the input data word. Latch 10 provides a 4-bit wide output designated by arrow 27 within FIG. 1. Similarly, latches 12 and 14 each provide a 4-bit wide output designated by arrows 28 and 29, respectively, within FIG. 1.

Conductor 30 couples a clocking signal to latch 10 for switching latch 10 between an acquire mode and a latched mode. When in the acquire mode, input signals received by input terminals 15–18 of latch 10 are allowed to ripple through to the 4-bit wide output 27 thereof. However, in the latched mode, latch 10 retains the 4-bit wide output 27 in a predetermined condition irrespective of the data signals subsequently received by input terminals 15–18. The predetermined condition retained by latch 10 when in its latched mode corresponds to the state of the input signals immediately prior to the change in the state of the clocking signal corresponding to transition from the acquire mode to the latched mode. Conductors 31 and 32 provide similar, but independent, clocking signals to latches 12 and 14, respectively.

Referring again to latch 10 within FIG. 1, the clocking signal transmitted by conductor 30 is generated at the output of OR gate 34. Similarly, the clocking signals transmitted to latches 12 and 14 by conductors 31 and 32 are generated by OR gates 36 and 38, respectively. A first terminal of each of gates 34, 36 and 38 is coupled to conductor 40 and to $\overline{WRITE}$ terminal 42. A second input of gate 34 is coupled to $\overline{NA}$ terminal 44. Similarly, a second input of gate 36 is coupled to $\overline{NB}$ terminal 45, and a second input of gate 38 is coupled to $\overline{NC}$ terminal 46. Latch 10 operates in the acquire mode when the clocking signal transmitted by conductor 30 is at a low level or logic "0". In contrast, when the clocking signal transmitted by conductor 30 is at a high level or logic "1", latch 10 operates in a latched mode wherein the 4-bit wide output 27 is insensitive to the state of the data bits received by input terminals 15–18. The clocking signal transmitted by conductor 30 assumes a logic "0" level only when both of the inputs to OR gate 34 are at a logic "0" level. Thus, when $\overline{WRITE}$ terminal 42 and $\overline{NA}$ terminal 44 are both at a logic "0" level, then latch 10 is in the acquire mode; if either $\overline{WRITE}$ terminal 42 or $\overline{NA}$ terminal 44 is at a logic "1" level, then latch 10 assumes the latched mode. Similarly, latch 12 is in the acquire mode only when both $\overline{WRITE}$ terminal and $\overline{NB}$ terminal 45 are both at a logic "0" level, and latch 14 is in the acquire mode only when $\overline{WRITE}$ terminal 42 and $\overline{NC}$ terminal 46 are both at a logic "0" level.

The dual stage latch shown in FIG. 1 includes a second, or output stage formed by 12-bit latch 48. Latch 48 includes input terminals for receiving output signals 27, 28 and 29 provided by latches 10, 12 and 14, respectively; in turn, latch 48 provides a 12-bit wide output designated 49. The output 49 of latch 48 may be coupled to the input switching network of a digital-to-analog converter circuit (not shown) for conversion to an analog signal.

Still referring to FIG. 1, $\overline{WRITE}$ terminal 42 is also coupled by conductor 40 to a first input of OR gate 50. A second input of OR gate 50 is coupled to $\overline{CONV}$ terminal 52. The output of OR gate 50 is coupled by conductor 54 to a terminal of latch 48 for supplying a clocking signal thereto. When the clocking signal supplied by conductor 54 is at a low level or logic "0", latch 48 is in an acquire mode wherein 12-bit output 49 is directly responsive to the twelve bits of data received from output signals 27, 28, and 29. However, when the clocking signal supplied by conductor 54 is at a high level (logic "1"), latch 48 is in a latched mode wherein output signals 49 are insensitive to the state of output signals 27, 28 and 29. When latch 48 is in the latched mode, output signals 49 reflect the state of the data received from output signals 27, 28 and 29 immediately before the clocking signal received from conductor 54 changed from a low level to a high level. The clocking signal supplied by conductor 54 is at a logic "0" when both $\overline{WRITE}$ terminal 42 and $\overline{CONV}$ terminal 52 are at logic "0" levels, and is otherwise at a logic "1" level.

The operation of the dual stage latch shown in FIG. 1 may be best understood by referring to the timing diagram shown in FIG. 2. Within FIG. 2, the waveform designated DATA corresponds to the status of the input data received by one of the input terminals 15–26. The waveform designated $\overline{NX}$ indicates the status of one or more of $\overline{NA}$, $\overline{NB}$, and $\overline{NC}$ terminals 44, 45 and 46, respectively. The waveforms designated $\overline{CONV}$ and $\overline{WRITE}$ correspond to the signals received by $\overline{CONV}$ terminals 52 and $\overline{WRITE}$ terminal 42, respectively. The waveform $Z_1$ corresponds to the condition of one bit of output signal 27, 28, or 29. For example, if the DATA waveform represents the most significant bit of the digital input (received by input terminal 15), then $Z_1$ represents the most significant bit of output signal 27. The waveform designated by $Z_2$ represents one bit within output signal 49. For example, if the $Z_1$ represents the most significant cant bit within output signal 27, then $Z_2$ represents the most significant output bit within output signal 49. Using this example, waveform $\overline{NX}$ represents signal $\overline{NA}$ since the most significant bit is within nybble A.

Still referring to FIG. 2, at the time designated by dashed line I, signal $\overline{NX}$ undergoes a transition from a high level to a low level, while at the time period designated by dashed line II, the state of the input data changes. However, output signal $Z_1$ does not change at time period II because $\overline{WRITE}$ is retained at a high level, maintaining latches 10, 12 and 14 in the latched mode. At the time period designated by dashed line III, $\overline{WRITE}$ undergoes a transition from a high level to a low level, allowing latches 10, 12 and 14 to assume the acquire mode. Accordingly, at time period III, output signal $Z_1$ changes state to reflect the condition of the input data signal. Output signal $Z_2$, however, remains unchanged since $\overline{CONV}$ is retained at a high level.

At time period IV designated within FIG. 2, both $\overline{NX}$ and $\overline{WRITE}$ undergo a transition from the low level to a high level, forcing latches 10, 12 and 14 to assume the latched mode. At time period V, the state of the input data again changes; however, since latches 10, 12 and 14 are in the latched mode, output signal $Z_1$ is unaffected by the change in the state of the input data. At time period VI, signal $\overline{CONV}$ undergoes a transition from a high level to a low level. Nonetheless, output signal $Z_2$ does not change because the $\overline{WRITE}$ signal is retained at a high level, thereby maintaining latch 48 in the latched mode. At time period VII, the $\overline{WRITE}$ signal undergoes a high to low level transition, allowing latch 48 to operate in the acquire mode; accordingly, output signal $Z_2$ changes state to reflect the condition of output signal $Z_1$. Finally, at time period VIII, the $\overline{CONV}$ and $\overline{WRITE}$ signals both undergo a low level to high level transition, causing latch 48 to again assume the latched mode of operation.

While not illustrated in FIG. 1, the dual stage latch circuit illustrated in FIG. 1 may be configured so as to be totally transparent to data flow. For example, if $\overline{CONV}$ terminal 52, $\overline{WRITE}$ terminal 42, $\overline{NA}$ terminal 44, $\overline{NB}$ terminal 45 and $\overline{NC}$ terminal 46 are all simultaneously driven to a low level or logic "0", then latches 10, 12, 14 and 48 are all simultaneously operated in the acquire mode, and accordingly, changes in the data presented to input terminals 15–26 effect an immediate change in output signals 49 generated by latch 48.

Figure 4:
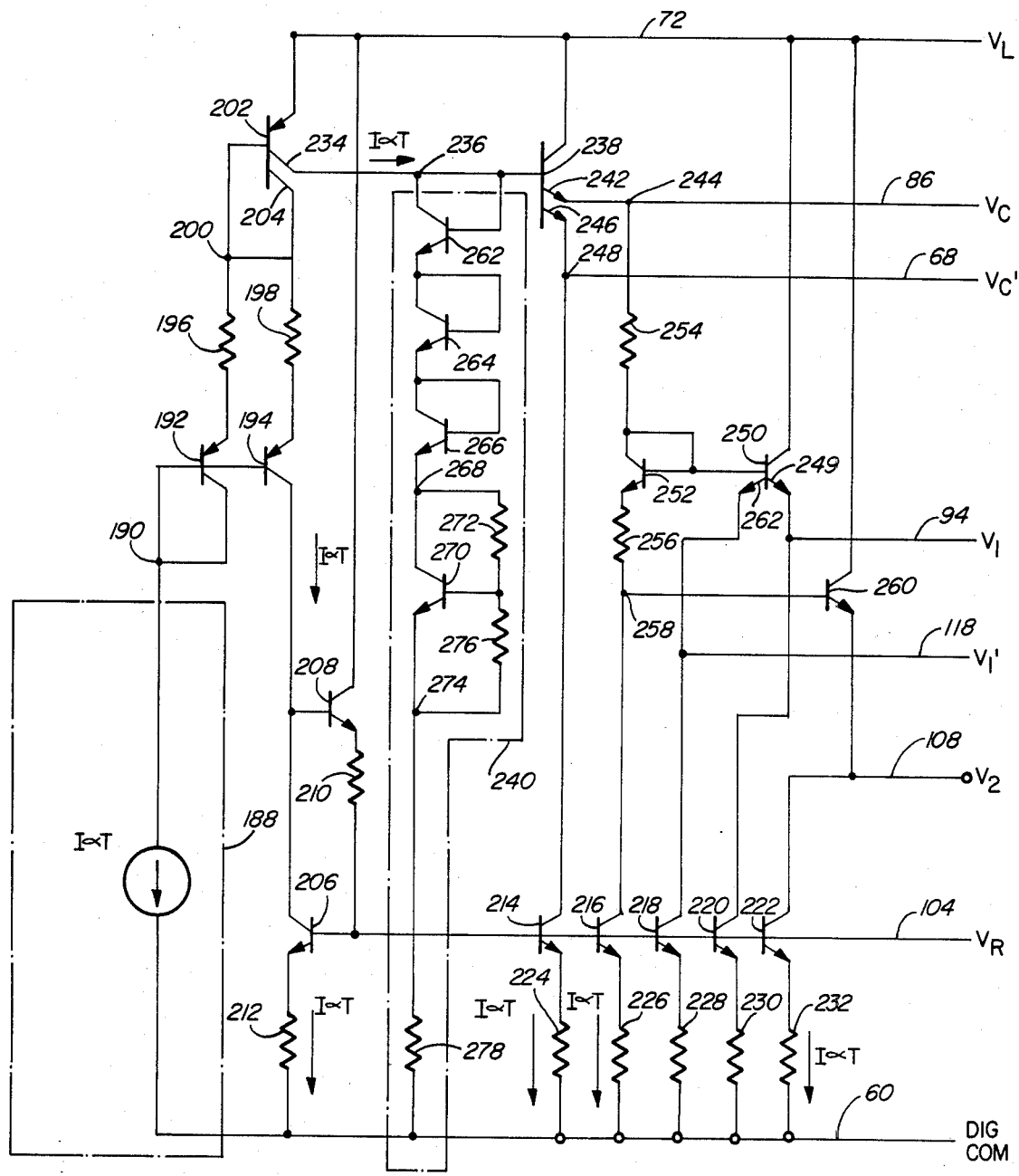
FIG. 4 is a circuit schematic of a bias circuit used to generate various reference voltages utilized by the latch circuit shown in FIG. 3.

The circuitry used to implement the dual stage latch illustrated within FIG. 1 is shown in FIGS. 3 and 4, wherein FIG. 3 illustrates those circuit components performing the desired logic functions and for latching one bit of the 12-bit signal, while FIG. 4 illustrates the bias circuitry used to generate various reference voltages required by the latch circuit shown in FIG. 3. Referring first to FIG. 3, data input terminal 56 is adapted to receive a binary data signal and corresponds to one of the input terminals 15-26 shown in FIG. 1. Input terminal 56 is coupled to the base terminal of PNP transistor 58, the collector of which is coupled to power supply conductor 60 for conducting a negative-most power supply voltage. The emitter of buffer transistor 58 is coupled by a first resistor 62 to node 64. A second resistor 66 is coupled between node 64 and conductor 68 which conducts reference voltage $V_C'$, described in greater detail below.

Resistors 62 and 66 together form a voltage dividing network for creating a voltage at node 64 derived from the input voltage presented at data input terminal 56 and referenced to $V_C'$ conductor 68. In the event that the voltage applied to input terminal 56 is substantially equal to or more positive than voltage $V_C'$, then node 64 is held essentially at the $V_C'$ reference voltage. Alternatively, resistor 66 could be replaced by a current source for supplying a fixed current from the positive-most power supply voltage. Buffer transistor 58, resistor 62 and resistor 66 together form an input means for providing the binary data signal received by input terminal 56 to node 64. While the emitter terminal of buffer transistor 58 is shown as being coupled to node 64 by resistor 62, resistor 62 could be replaced by a short or by one or more diode junctions. In any event, resistor 62, or the shorted connection or one or more diodes substituted therefor, serve as a means for coupling the emitter terminal of buffer transistor 58 to node 64. In addition, buffer transistor 58, while illustrated as a PNP transistor, could be formed as an NPN transistor having its base terminal coupled to data input terminal 56 and its emitter terminal coupled either directly, or through a resistor or one or more diodes to node 64.

Still referring to FIG. 3, node 64 is coupled to the base terminal of input transistor 70. The collector terminal of transistor 70 is coupled to a power supply conductor 72 for conducting the positive-most power supply voltage. The emitter terminal of transistor 70 is coupled to a first emitter terminal 74 of a double-emitter bias transistor 76. The collector of transistor 76 is coupled to node 78 and to output terminal 80. The output signal generated at output terminal 80 is designated $Z_1$ and corresponds, for example, to one of the four output signals 27 provided by latch 10 within FIG. 1.

The output signal provided at output terminal 80 is developed across a load comprised by resistor 82 and transistor 84. Resistor 82 is coupled between node 78 and the emitter terminal of load transistor 84, the collector terminal of which is coupled to power supply conductor 72, and the base terminal of which is coupled to $V_C$ voltage reference conductor 86. Thus, the load for bias transistor 76 is comprised by resistor 82 coupled in series with the emitter-base junction of transistor 84 between node 78 and voltage reference conductor 86. Due to the amplification provided by transistor 84, the base current drawn thereby from $V_C$ conductor 86 is only a small fraction of the current conducted by the emitter terminal thereof. Nonetheless, an alternate embodiment of the present invention may also be provided by substituting a diode in place of transistor 84 wherein the anode of the diode is coupled to $V_C$ conductor 86 and the cathode of the diode is coupled to the end of resistor 82 opposite node 78.

Node 78 is also coupled to the base terminal of a feedback transistor 88. In the preferred embodiment of the present invention, feedback transistor 88 is a double emitter device, a first emitter 90 thereof being coupled to a second emitter terminal 92 of bias transistor 76, and the collector terminal of feedback transistor 88 being coupled to power supply conductor 72. The base terminal of bias transistor 76 is coupled to a reference voltage conductor 94 which conducts reference voltage $V_1$.

Transistor 70 and first emitter 74 of bias transistor 76 form an input portion of the latch circuit for creating an output signal at node 78 while the latch circuit is operated in an acquire mode. Emitter 90 of feedback transistor 88 and second emitter 92 of bias transistor 76 form a feedback portion of the latch circuit for retaining the state of the output signal developed at node 78 after the latch circuit is switched from its acquire mode to a latched mode. Those skilled in the art will appreciate that double-emitter bias transistor 76 may be replaced by two separate single-emitter transistors having common collectors and common bases; in either case, the double-emitter transistor or two single-emitter transistors may be designated as a bias transistor means.

Still referring to FIG. 3, a current steering, emitter-coupled switch including transistors 96 and 98 is provided for switching the first stage of the dual stage latch circuit between its acquire and latched modes. The collector of transistor 96 is coupled to the emitter of transistor 70 and emitter 74 of bias transistor 76. The collector of transistor 98 is coupled to emitter 92 of bias transistor 76 and to emitter 90 of feedback transistor 88. The emitter terminals of transistors 96 and 98 are each coupled to the collector of current source transistor 100. The emitter terminal of transistor 100 is coupled by resistor 102 to power supply conductor 60. The base terminal of transistor 100 is coupled to reference voltage conductor 104 which conducts a regulated $V_R$ voltage generated by the bias circuitry. As is described in further detail below, reference voltage $V_R$ is regulated so as to cause the current conducted by the collector of transistor 100 to be substantially porportional to temperature.

The base terminal of transistor 98 is coupled to conductor 106 for receiving a clocking signal used to switch the first stage of the latch circuit between its acquire and latched modes. For example, if data input terminal 56 corresponds to input terminal 15 of FIG. 1, then conductor 106 corresponds with clocking signal conductor 30 shown in FIG. 1. The base terminal of transistor 96 is coupled to reference voltage conductor 108 which conducts reference voltage $V_2$ generated by the bias circuitry. When the voltage upon conductor 106 is significantly above reference voltage $V_2$, transistor 98 conducts the current provided by current source transistor 100 to emitters 90 and 92, thereby retaining the first stage of the latch circuit in the latched mode. Conversely, when the voltage upon conductor 106 is significantly below reference voltage $V_2$, transistor 96 conducts the current provided by current source transistor 100 to emitter 74 and the emitter of transistor 70 for operating the first stage of the latch circuit in the acquire mode.

FIG. 3 also illustrates the manner in which OR gates 34, 36, and 38 (shown in FIG. 1) may each be formed to provide a clocking signal to conductor 106. Input terminal 110 receives control signal $\overline{N_X}$ which generically denotes any of the control signals $\overline{NA}$, $\overline{NB}$, and $\overline{NC}$ shown in FIG. 1. Control terminal 110 is coupled to the base of PNP transistor 112, the collector of which is coupled to negative-most power supply conductor 60', and the emitter terminal of which is coupled to node 114. Resistor 116 is coupled between node 114 and reference voltage conductor 118 which conducts reference voltage $V_1'$. As will be explained in greater detail below, reference voltage $V_1'$ is approximately equal to reference voltage $V_1$ conducted by conductor 94. Node 114 is also coupled to the base terminal of emitter follower transistor 120, the collector terminal of which is coupled to the positive-most power supply conductor 72. The emitter terminal of transistor 120 is coupled to conductor 106 at node 122. Resistor 124 extends between node 122 and power supply conductor 60'.

Similarly, $\overline{WRITE}$ input terminal 126 is coupled to the base terminal of PNP transistor 128, the collector terminal of which is coupled to power supply conductor 60'. The emitter terminal of transistor 128 is coupled to node 130, and resistor 132 extends between node 130 and $V_1'$ conductor 118. Double-emitter follower transistor 134 has its base terminal coupled to node 130 and its collector terminal coupled to power supply conductor 72. First emitter terminal 136 of transistor 134 is coupled to node 122.

The coupling between emitter 136 and the emitter of transistor 120 effectively provides the OR logic function represented symbolically by each of logic states 34, 36 and 38 within FIG. 1. Assuming that $\overline{N}_X$ terminal 110 is driven by a low voltage significantly below reference voltage $V_1'$, then node 114 is pulled to within one base-emitter junction voltage of terminal 110. If $\overline{WRITE}$ terminal 126 is also driven by a low voltage significantly below reference voltage $V_1'$, then node 130 is pulled to within one base-emitter junction voltage of terminal 126. In this event, follower transistors 120 and 134 establish a low level (or logic "0") at node 122. Transistor 98 is thereby held non-conductive, and the first stage of the dual-stage latch circuit is operated in its acquire mode. On the other hand, in the event that either $\overline{NX}$ terminal 110 or $\overline{WRITE}$ terminal 126 is driven to a voltage at or above reference voltage $V_1'$, then node 114 or node 130, respectively, assumes a voltage substantially equal to reference voltage $V_1'$, and node 122 is thereby established with a voltage that is one base-emitter junction voltage below reference voltage $V_1$40. As will be shown in greater detail below, voltage $V_1'$ is more than one base-emitter junction voltage above reference voltage $V_2$. Accordingly, when either $\overline{NX}$ terminal 110 or $\overline{WRITE}$ terminal 126 is at or above voltage $V_1'$, the voltage at node 122 is more positive than reference voltage $V_2$, allowing transistor 98 to conduct current to the feedback portion of the first stage of the latch.

FIG. 3 also illustrates the circuitry forming one bit of the 12-bit second stage latch 48 shown in FIG. 1. The second stage latch circuitry operates in a manner similar to that described above with regard to the first stage of the latch circuit. The second stage of the latch circuit includes a double-emitter bias transistor 138 having first and second emitters 140 and 142, respectively, similar to bias transistor 76 within the first stage of the latch circuit. The collector of bias transistor 138 is coupled to node 144. Load resistor 146 couples node 144 to the emitter terminal of load transistor 148. The base terminal of load transistor 148 is coupled to $V_C$ conductor 86. The collector of load transistor 148 is coupled to node 150 and to an output terminal 152 ($V_O$). Node 150 is coupled by a second load resistor 154 to power supply conductor 72.

Feedback transistor 88, referred to above with regard to the first stage of the latch circuit, includes a second emitter 156 coupled to emitter terminal 140 of bias transistor 138 and to the collector terminal of reference transistor 158 within the lower level of the series gated structure. Feedback transistor 88, and specifically emitter terminal 156, effectively duplicates the function of input transistor 70 within the first stage of the latch circuit; the output signal provided to output terminal 80 serves as an input signal to the second stage of the dual stage latch circuit.

Emitter terminal 142 of bias transistor 138 is coupled to the emitter terminal of feedback transistor 160 and to the collector terminal of current switching transistor 162 within the lower level of the series gated structure. A feedback path is established by coupling node 144 to the base terminal of feedback transistor 160 for latching the state of the signal developed at node 144 as current is switched from transistor 158 to transistor 162. Node 144 is also coupled to output terminal 164 ($Z_2$) for providing an output signal corresponding to the data acquired and/or latched by the second stage of the latch circuit. The collector of feedback transistor 160 is coupled to power supply conductor 72.

Now referring to the current switch within the lower level of the second stage of the latch circuit shown in FIG. 3, the emitter terminals of transistors 158 and 162 are commonly coupled to the collector of current source transistor 166. The emitter terminal of transistor 166 is coupled by resistor 168 to power supply conductor 60. The base terminal of current source transistor 166 is coupled to $V_R$ conductor 104 which is regulated so as to maintain the current provided by the collector of current source transistor 166 substantially porportional to temperature. The base terminal of transistor 162 is coupled to conductor 170 for receiving a clocking signal corresponding to the clocking signal transmitted by conductor 54 shown in FIG. 1. The base terminal of transistor 158 is coupled to $V_2$ conductor 108 for receiving a reference voltage from the bias circuit against which the clocking signal is compared.

Referring briefly to FIG. 1, it will be recalled that the clocking signal transmitted by conductor 54 to the second stage of the latch circuit is the OR function of the $\overline{CONV}$ and $\overline{WRITE}$ signals. Referring again to FIG. 3, such an OR function is created at node 172. Node 172 is coupled to a second emitter terminal 174 of follower transistor 134, to the emitter of an additional follower transistor 176, and through a resistor 178 to power supply conductor 60'. The collector of follower transistor 176 is coupled to positive-most power supply conductor 72, and the base terminal thereif is coupled to node 180. Node 180 is coupled to the emitter of PNP transistor 182 and is further coupled through resistor 184 to $V_1'$ conductor 118. The collector terminal of transistor 182 is coupled to power supply conductor 60', while the base terminal thereof is coupled to $\overline{CONV}$ terminal 186.

If either $\overline{WRITE}$ terminal 126 or $\overline{CONV}$ terminal 186 is at a high level, then either node 130 or node 180, respectively, will have a voltage approximately equal to reference voltage $V_1'$; conductor 170 is thereby established at a voltage above reference voltage $V_2$, causing the second stage of the latch circuit to assume the latched mode. On the other hand, if $\overline{WRITE}$ terminal 126 and $\overline{CONV}$ 186 are both held at a low level, then the voltage established on conductor 170 is below reference voltage $V_2$, and accordingly, the second stage of the latch circuit is operated in the acquire mode.

Referring now to the bias circuitry shown in FIG. 4, the power supply conductors and reference voltage conductors common with those already described in regard to FIG. 3 are designated by corresponding reference numerals. As mentioned above, the voltage $V_R$ established on reference voltage conductor 104 is regulated so as to cause the current sources within the latch circuitry to provide currents substantially proportional to temperature. In this regard, a current source designated by dashed block 188 is coupled between power supply conductor 60 and a node 190 for establishing a regulated reference current substantially proportional to temperature. The manner of constructing such a regulated current source is well known in the art and essentially involves the application of a difference voltage across a resistor wherein the difference voltage corresponds to the difference in the base-emitter junction voltages of two or more semiconductor junctions having respective current densities maintained in a fixed ratio. For example, one such circuit is disclosed in U.S. Pat. No. 3,930,172.

Node 190 is coupled to the base and collector terminals of diode-connected PNP transistor 192 as well as to the base terminal of PNP transistor 194. The emitter terminals of transistors 192 and 194 are coupled through resistors 196 and 198, respectively, to node 200. Node 200 is in turn coupled to the base terminal of PNP transistor 202 as well as to a first collector terminal 204 thereof. The emitter terminal of transistor 202 is coupled to power supply conductor 72. PNP transistors 192 and 194 are matched devices formed in an identical manner to have identical operating characteristics. Similarly, resistors 196 and 198 are also matched to each other. Accordingly, transistor 194 mirrors the current within transistor 192 and sources a collector current substantially identical to the temperature proportional current provided by current source 188. The collector terminal of transistor 194 is coupled to the collector terminal of transistor 206 and to the base terminal of follower transistor 208. The collector terminal of transistor 208 is coupled to power supply conductor 72, and the emitter terminal thereof is coupled through resistor 210 to the base terminal of transistor 206 and to $V_R$ conductor 104. The emitter terminal of transistor 206 is coupled through resistor 212 to power supply conductor 60. Due to the relatively high beta of transistor 208 and the relatively small amount of emitter current conducted thereby, the current drawn by the base terminal of transistor 208 is insignificant relative to the current sourced by the collector terminal of transistor 194. Accordingly, substantially all of the current sourced by the collector of transistor 194 is conducted by the collector of transistor 206. Transistor 208 biases $V_R$ conductor 104 at a voltage sufficient to allow transistor 206 to conduct the current supplied to the collector terminal thereof.

Still referring to FIG. 4, a plurality of current sources are biased by $V_R$ conductor 104 for providing regulated temperature proportional currents. Transistors 214, 216, 218, 220, and 222 each has its base terminal coupled to $V_R$ conductor 104 and an emitter terminal coupled through resistors 224, 226, 228, 230, and 232, respectively, to power supply conductor 60. Transsitors 214–222 are each matched with transistor 206, and resistors 224–232 are each matched with resistor 212. Accordingly, each such current source draws a collector current equal to that conducted by the collector terminal of transistor 206, which current is proportional to temperature. Briefly referring to FIG. 3, current source transistors 100 and 166 are also matched to transistor 206, and resistors 102 and 168 are also matched to resistor 212; accordingly, the current drawn by the collector terminals of current source transistors 100 and 166 is also a regulated current proportional to temperature and equal in magnitude to that provided by current source 188.

Referring again to FIG. 4, the manner in which reference voltages $V_C$, $V_1$ and $V_2$ are generated will now be described. Transistor 202 includes a second collector terminal 234 coupled to node 236 and to the base terminal of emitter follower transistor 238, the collector terminal of which is coupled to power supply conductor 72. Node 236 is also coupled by a circuit network designated by dashed lines 240 to power supply conductor 60. As will be explained in greater detail below, network 240 determines the nominal voltage established at node 36, as well as the temperature tracking characterisitcs thereof. Follower transistor 238 includes a first emitter terminal 242 coupled to node 244 and $V_C$ conductor 68. Node 248 is coupled to the collector terminal of current source transistor 214. A conduction path, to be described in greater detail below, is also established between node 244 and the collector terminal of current source transistor 216. Accordingly, emitter terminal 242 and 246 are forward biased, and the voltages resulting upon $V_C$ conductor 86 and $V_C'$ conductor 68 are each one base-emitter junction voltage below the voltage at node 236. Referring briefly to FIG. 3, $V_C'$ conductor 68 sources current to the input buffer network formed by resistor 66, resistor 62 and transistor 58, which current may vary substantially depending upon the status of the data input signal received at input terminal 56. In contrast, the only currents drawn from $V_C$ conductor 86 are relatively small base currents drawn by load transistors 84 and 148. Thus, while the voltages established on $V_C$ conductor 86 and $V_C'$, conductor 68 are substantially equal, significant current transients within conductor 68 are isolated from conductor 86.

Briefly referring to FIG. 3, it will be recalled that reference voltage $V_1$ transmitted by conductor 94 establishes a switching threshold within the upper level of the series gated latch structures. Referring again to FIG. 4, $V_1$ conductor 94 is coupled to the collector of current source transistor 220 and to a first emitter 249 of follower transistor 250, the collector terminal of which is coupled to power supply conductor 72. The base terminal of transistor 250 is coupled to the base and collector terminals of diode-connected transistor 252 and through resistor 254 to node 244. The emitter terminal of transistor 252 is coupled through resistor 256 to node 258, which in turn is coupled to the collector terminal of current source transistor 216 as well as to the base terminal of follower transistor 260. The collector terminal of transistor 260 is coupled to power supply conductor 72, and the emitter terminal thereof is coupled to the collector terminal of current source transistor 222 as well as to $V_2$ reference voltage conductor 108. Second emitter 262 of transistor 250 is coupled to the collector terminal of current source transistor 218 and to $V_1'$, conductor 118.

With reference to FIG. 4, the base current drawn by follower transistors 250 and 260 is relatively insignificant in comparison to the current drawn by the collector terminal of current source transistor 216. Accordingly, the current conducted by resistor 254 is substantially equal to the temperature proportional current sourced by transistor 216. In the preferred embodiment of the present invention, the magnitude of resistor 254 is one-half of the magnitude of load resistors 82 and 146 within the first and second stages of the latch circuit shown in FIG. 3. Therefore, the voltage drop developed across resistor 254 within the bias circuit is one-half that dropped across load resistors 82 and 146 due to the current provided by current source transistors 100 and 166, respectively. The voltage $V_1$ which results on conductor 94 is equal to the voltage on $V_C$ conductor 86, less the voltage drop across resistor 254 and less the base-emitter junction voltage drop associated with emitter 249 of follower transistor 250. Similarly, the $V_140$ voltage resulting on conductor 118 is the $V_C$ voltage less the voltage drop across resistor 254 and less the emitter-base junction voltage drop associated with emitter 262 of transistor 250.

Referring again to FIG. 3, the voltage established at output terminal 80 switches between a high and a low level. The high level voltage at output terminal 80 is equal to voltage $V_C$ on conductor 86 less the emitter-base junction voltage of load transistor 84 and less a small voltage drop across load resistor 82 due to base current drawn by transistor 88. The low level voltage established at output terminal 80 is equal to reference voltage $V_C$ less the emitter-base junction voltage of load transistor 84 and less the voltage drop across load resistor 82 due to the temperature proportional current sourced by the collector terminal of current source transistor 100 Therefore, the voltage swing associated with the output signal, i.e., the difference between the high level output voltage and low level output voltage, is the gate current provided by current source transistor 100 multiplied by the resistance of load resistor 82, plus any differential in the emitter-base junction voltage of load transistor 84 due to changes in the current conducted thereby. The midpoint of the output voltage swing is equal to reference voltage $V_C$ less an average emitter-base junction voltage associated with load transistor 84 and less one-half the regulated gate current times the resistance of load resistor 82. Since the voltage drop associated with resistor 254 (see FIG. 4) is one-half the voltage dropped across load resistor 82 by the regulated gate current, bias voltage $V_1$ is substantially near the midpoint of the output voltage swing. Furthermore, since the magnitude of the current within resistor 254 (see FIG. 4) and the regulated gate current within the latch are always identical, bias voltage $V_1$ remains essentially at the midpoint of the output voltage swing despite variations in temperature.

It is known to those skilled in the art that, in order to maintain a minimum degree of noise immunity, an emitter coupled current switch should be able to maintain at least a minimum predetermined ratio of currents within the emitter of the transistor which is to be switched on and the emitter of the transistor which is to be switched off. The ratio of these currents may be expressed as $I_{ON}/I_{OFF}$. When the respective currents are maintained in this ratio, then the base-emitter voltages of the ON transistor and OFF transistor may be expressed as follows:

$$V_{BE(ON)} = kT/q[\ln(I_{ON}/I_0)];$$

$$V_{BE(OFF)} = kT/q[\ln(I_{OFF}/I_0)],$$

where k is Boltman's constant, T is temperature, q is the charge of an electron, and $I_0$ is the quiescent minority carrier current associated with the emitter-base junction. Accordingly, the difference in the base-emitter junction voltages of the on and off transistors necessary to maintain the required ratio of on-current to off-current may be expressed as follows:

$$\Delta V \overset{\Delta}{=} V_{BE(ON)} - V_{BE(OFF)}$$
$$= kT/q[\ln(I_{ON}/I_0) - \ln(I_{OFF}/I_0)]$$
$$= kT/q[\ln(I_{ON}/I_{OFF})].$$

Therefore, so long as the difference in the voltages applied to the base terminals of an emitter coupled pair of transistors is proportional to temperature, a given ratio of on-current to off-current can be maintained despite variations in temperature.

Referring again to FIG. 3, since the magnitude of the output voltage swing provided at output terminal 80 is substantially proportional to temperature, and since reference voltage $V_1$ is maintained substantially at the midpoint of the output voltage swing, the difference in the voltages applied to the base terminal of feedback transistor 88 and the base terminal of bias transistor 76 will also be proportional to temperature. Therefore, the ratio of on-current to off-current as between emitter 90 of transistor 88 and emitter 92 of transistor 76 is substantially constant despite variations in temperature. Consequently, the nominal output voltage swing associated with output terminal 80 may be selected to be relatively small (e.g., 300-400 millivolts) in comparison to prior art latch circuitry.

Reduction in the size of the nominal output voltage swing facilitates high speed operation of the latch circuit for several reasons. First, the magnitude of the transition between the high output level and low output level is reduced, allowing the latch circuit to switch between the high output level and low output level more quickly. Secondly, a reduction in the output voltage swing correspondingly reduces the possibility that the forward biased base-collector junction of bias transistor 76 will become sufficiently forward biased to enter the saturation mode of operation.

The above analysis of the voltage differential between the bias voltage $V_1$ and the high and low output levels established at output terminal 80 ignores changes in the emitter-base junction voltage associated with load transistor 84. In actuality, the change in this emitter-base junction voltage may well be greater than 100 millivolts at nominal temperature assuming reasonably high beta values. The above described change in the emitter-base junction voltage of the load transistor tends to skew the bias level $V_1$ slightly away from the actual midpoint of the output voltage swing. In the preferred embodiment of the present invention, this skew is compensated by making the emitter regions of emitters 74 and 92 of bias transistor 76 larger than the emitter of transistor 70 and emitter 90 of feedback transistor 88. Similarly, emitter regions 140 and 142 of bias transistor 138 are made larger than emitter 156 of transistor 88 and the emitter of transistor 160.

As an example of how the increased emitter area associated with the bias transistor tends to compensate for the skew introduced by variations in the emitter-base voltage of the load transistor, it will be assumed that emitter 92 of bias transistor 76 is double the emitter area of emitter 90 of feedback transistor 88. It will also be assumed that the temperature of the pertinent emitter-base junctions is room temperature (i.e., 300° K.). Finally, it will be assumed that the minimum ratio of on-current to off-current within the emitter-coupled switch is 100:1.

Taking first the case where the bias transistor is on and the feedback transistor is off, the required potential difference between the bias voltage $V_1$ and the output low level established at output terminal 80 is $$\Delta V = kT/q[\ln(J_{BIAS}/J_{FB})],$$

wherein $J_{BIAS}$ corresponds to the current density within the bias transistor and $J_{FB}$ corresponds to the current density within the feedback transistor. Since the current density within the bias transistor is one-half that within the feedback transistor for a given amount of current, the above expression may be rewritten as follows:

$$\Delta V = kT/q[\ln(\tfrac{1}{2}I_{BIAS}/I_{FB})].$$

Solving for $\Delta V$, $$\Delta V = (26 \text{ millivolts})\ln[(\tfrac{1}{2})(100/1)]$$
$$= 102 \text{ millivolts}.$$

Therefore, the output low level established at output terminal 80 need be only 102 millivolts below bias voltage $V_1$ to maintain the desired current ratio. On the other hand, assuming that feedback transistor 88 is on and bias transistor 76 is off, then the required voltage differential between the output high level established at output terminal 80 and the $V_1$ bias voltage is $$\Delta V = kT/q[\ln(J_{FB}/J_{BIAS})]$$
$$= kT/q[\ln(I_{FB}/\tfrac{1}{2}I_{BIAS})]$$
$$= (26 \text{ millivolts})\ln[(2)(100/1)];$$
$$= 138 \text{ millivolts}.$$

Therefore, the output high level at output terminal 80 must be 138 millivolts more positive than bias voltage $V_1$ in order to maintain the desired minimum current ratio. In contrast, the required voltage differential between the output low level and the $V_1$ bias voltage was only 102 millivolts. Accordingly, those skilled in the art will appreciate that by making the emitter regions of bias transistor 76 larger than the emitter of transistor 70 and emitter 90 of feedback transistor 88, the skew in the output level introduced by variations in the emitter-base voltage of load transistor 84 may be partially or even completely compensated. Furthermore, increasing the size of the emitter regions of bias transistor 76 and 138 tends to decrease the parasitic collector resistance associated with these devices, thereby further reducing the possibility that these transistors will become saturated at higher temperatures.

Still referring to FIG. 3, a further advantage of increasing the emitter sizes, the hence the overall device sizes of bias transistors 76 and 138 relates to the ability of the latch circuit to switch from the acquire mode to the latch mode when the data input signal is low without losing the state of the data. For example, assuming that the clocking signal transmitted by conductor 106 (see FIG. 3) is at a low level for allowing the first stage of the latch circuit to assume the acquire mode, and assuming that the data input signal is at a low level, then the gate current flows through transistor 96 and through emitter 74 of bias transistor 76 for establishing a low output level at node 78. When the clocking signal transmitted by conductor 106 is switched to a high level, transistor 98 conducts the gate current formerly conducted by transistor 96, and emitter 74 of bias transistor 76 can no longer conduct current needed to maintain node 78 at a low level. Consequently, the voltage at node 78 may temporarily move in the positive direction, at least until emitter 92 of bias transistor 76 conducts a sufficient amount of current to reinforce the low level at node 78.

However, if a significant amount of capacitance is associated with emitter 90 of transistor 88, emitter 92 of transistor 76 and the collector of transistor 98, then the collector current conducted by transistor 98 may initially be dissipated discharging such capacitance before causing emitter 92 of bias transistor 76 to become conductive. In this event, the voltage at node 78 may rise near or above bias voltage $V_1$ before emitter 92 becomes fully conductive; as a result, the low voltage level established at node 78 during the acquire mode may be lost. The aforementioned problem regarding loss of data becomes even more critical when the magnitude of the nominal output voltage swing is designed to be relatively small. However, by increasing the overall device size of bias transistor 76 due to the increased emitter sizes of emitters 74 and 92, the capacitance associated with node 78 is increased, thereby slowing the rate by which the voltage at node 78 rises.

Referring again to FIG. 3, it will be noted that resistor 154 is coupled between power supply conductor 72 and the collector of load transistor 148 for generating an output signal at terminal 152 isolated from the output signal developed at node 144 and coupled to feedback transistor 160. While load resistors 82 and 146 are selected to provide a limited nominal swing (e.g., 300 millivolts) to avoid saturation of the bias transistors 76 and 138, resistor 154 may be selected to provide an output voltage swing having a magnitude of 800 millivolts or greater. Thus, the output signal generated at output terminal 152 may be relatively large for conveniently driving other types of switching circuitry.

Still referring to FIG. 3, it will be recalled that the reference voltage $V_1'$ transmitted by conductor 118 is approximately equal to reference voltage $V_1$ transmitted by conductor 94. By terminating resistor 116 and resistor 132 to $V_1'$ conductor 118, the most positive voltage at node 122 is limited to one emitter-base junction voltage below reference voltage $V_1'$. Correspondingly, the most negative voltage impressed upon the collector terminal of switching transistor 98 is one emitter-base junction voltage below reference voltage $V_1'$. Accordingly, the base-collector junction of transistor 98 is never allowed to become significantly forward biased, and saturation of transistor 98 is thereby prevented. For similar reasons, saturation of transistor 162 within the second stage of the latch circuit is also prevented.

The most positive voltage (or high level) of the clock signal received by the base terminal of transistor 98 is approximately one emitter-base junction voltage below reference voltage $V_1'$. Bias voltage $V_2$ must be several hundred millivolts below such a high level to distinguish between a high level and a low level clock signal. Referring to FIG. 4, reference voltage $V_2$ is approximately equal to reference voltage $V_1$ less the voltage drop across resistor 256 and less one emitter-base junction voltage. Accordingly, reference voltage $V_2$ is more negative than the high level clock signal to the extent of the voltage drop across resistor 256. Since the current conducted by resistor 256 is proportional to temperature, the voltage differential between bias voltage $V_2$ and the high level clock signal presented to the base terminal of transistor 98 also increases proportionally with temperature, thereby ensuring that the ratio of on-current within transistor 98 to the off-current within transistor 96 is maintained over the temperature range.

Another advantage of the present invention is the ease with which the latch circuit input terminals may be made compatible with output signals generated by other logic families, such as TTL logic circuitry. The reference voltages $V_C$, $V_1$ and $V_2$ can be established within a relatively wide range of nominal values. Furthermore, the temperature coefficient of such reference voltages may also be selected over a wide range. Consequently, the switching threshold voltage levels for the data input signal and the clock signal within the upper level and lower level, respectively, of the series gated structure may easily be set to be within the center of the input signal swing. In particular, circuit network 240 within FIG. 4 may be so chosen to set the $V_1$ and $V_2$ bias voltages to levels which cause the switching thresholds associated with the $D_n$ input terminal 56 and with the $\overline{N_X}$ terminal 110, $\overline{WRITE}$ terminal 126, and $\overline{CONV}$ terminal 186 to each be near the center of the TTL voltage switching region. Furthermore, the temperature coefficients of reference voltages $V_1$ and $V_2$ may be designed to allow the inputs of the latch circuit to be TTL compatible over a wide temperature range.

Referring to FIG. 4, the particular components shown within circuit network 240 have been found to be suitable for interfacing the various data input terminals and clock signal input terminals to TTL circuitry. As shown in FIG. 4, circuit network 240 includes a chain of three series-coupled, diode-connected transistors 262, 264, and 266 coupled between node 236 and node 268. Node 268 is also coupled to the collector terminal of transistor 270 and to a first end of resistor 272, the other end of which is coupled to the base terminal of transistor 270. The emitter terminal of transistor 270 is coupled to node 274, and resistor 276 is coupled between node 274 and the base terminal of transistor 270. Those skilled in the art will appreciate that transistor 270, resistor 272 and resistor 276 are configured as a so-called $V_{BE}$ multiplier wherein the voltage dropped across resistor 272 is equal to the emitter-base junction voltage of transistor 270 multiplied by the ratio of resistor 272 to resistor 276. Node 274 is coupled by resistor 278 to power supply conductor 260.

As an example of how the component values within circuit network 240 may be selected to facilitate compatibility of the latch circuit input terminals with TTL logic signals, the following assumptions are made. It is assumed that the collector area associated with collector 234 of transistor 202 is one-half the area of collector 204 for causing the current sourced by collector terminal 234 to equal the current (I) drawn by regulated current source 188. Since the base terminal of transistor 238 draws an insignificant amount of current from node 236, the current conducted by circuit network 240 is substantially equal to current I. Thus, the current conducted by circuit network 240 is equal to the current I supplied by the collector terminal of current source transistor 216. It is further assumed that transistors 262, 264, 266, 270, 238, 252, and 260 are all matched devices having equal emitter-base junction voltages ($V_{BE}$) at a given current and temperature. It is further assumed that resistor 254 has a magnitude of one-half that of the load resistors 82 and 146 within the latch circuit (see FIG. 3), and that resistor 256 has a magnitude equal to that of load resistors 82 and 146. Given the above assumptions, an expression may be written for the reference voltage $V_2$ relative to the power supply voltage conducted by conductor 60 as follows:

$$V_2 = I \cdot R278 + V_{BE(270)} \cdot [1 + R272/R276] +$$
$$V_{BE(266)} + V_{BE(264)} + V_{BE(262)} -$$
$$V_{BE(238)} - I \cdot R254 - V_{BE(252)} - I \cdot R256 - V_{BE(260)}.$$

Simplifying the above expression according to the assumptions made above results in the following:

$$V_2 = I \cdot R278 + V_{BE} \cdot [1 + R272/R276] - I \cdot R_L \cdot (1.5)$$

wherein $R_L$ designates the value of load resistors 82 and 146. If the magnitude of resistor 278 is expressed as $$R278 = (k+1.5)R_L,$$

and if the constant n is allowed to designate the quantity $(1+R272/R276)$, then the expression for $V_2$ may be rewritten as follows:

$$V_2 = k(I \cdot R_L) + n(V_{BE}).$$

The tracking rate of voltage $V_2$ over temperature may then be expressed as follows:

$$\Delta V_2/\Delta T = k[\Delta(I \cdot R_L)/\Delta T] + n[\Delta V_{BE}/\Delta T].$$

In order to solve the above expressions for values of k and n, it is further assumed that the nominal $V_{BE}$ is 700 millivolts and that the temperature coefficient of $V_{BE}$ is $-2$ millivolts per degree C. It will be further assumed that the nominal magnitude of $I \cdot R_L$ is 300 millivolts (nominal output voltage swing) and that the temperature coefficient of the quantity $I \cdot R_L$ is $+1$ millivolt per degree C. Substitution of the values $n=1.192$ and $k=2.385$ render a resulting voltage for $V_2$ of 1.55 volts above the negative-most power supply and a temperature coefficient for $V_2$ of approximately zero. The corresponding $V_1$ bias level is nominally 2.55 volts above the negative-most power supply. These voltages for $V_1$ and $V_2$ are suitable for discriminating high and low level TTL input signals referenced to the negative-most power supply, and the small temperature coefficients associated therewith assures that they do not shift significantly over temperature. In addition, the resulting $V_2$ voltage is sufficiently above the negative-most power supply to avoid saturation of current source transistors 100 and 166 within the latch circuitry (see FIG. 3).

Now referring to FIG. 5, a latch circuit of the type described with reference to FIG. 3 is illustrated but differs therefrom by providing high fan-out capability to drive a plurality of other gates of the same type logic family. The conductors and device components shown in FIG. 5 which correspond to those previously described with regard to the first stage of the latch circuit shown in FIG. 3 are designated by corresponding reference numerals.

Figure 5:
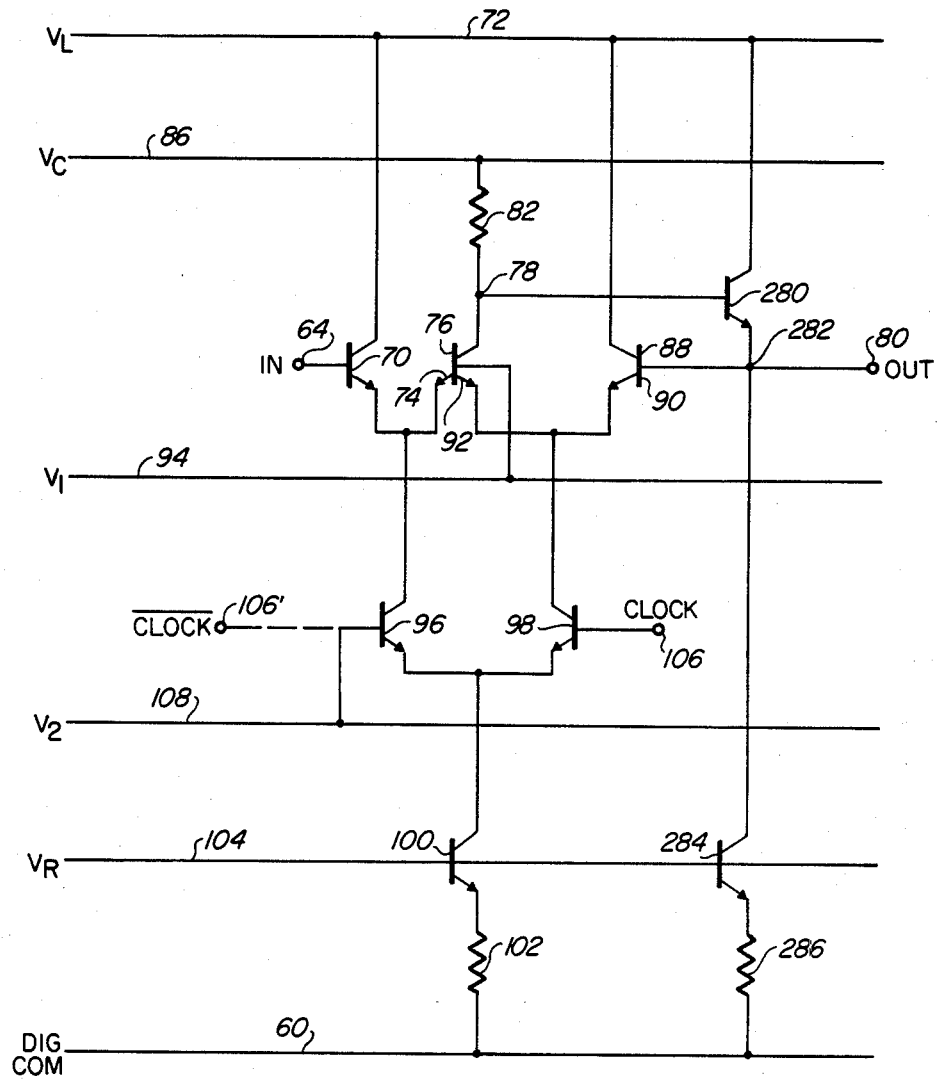
FIG. 5 is a circuit schematic of a high fan-out embodiment of one stage of the latch circuit shown in FIG. 3.

As shown in FIG. 5, the high fan-out embodiment of the latch circuit eliminates load transistor 84 and couples load resistor 82 directly between node 78 and $V_C$ conductor 86. In addition, a follower transistor 280 is inserted within the feedback path between node 78 and the base terminal of feedback transistor 88. Transistor 280 has its base terminal coupled to node 78, its collector terminal coupled to power supply conductor 72, and its emitter terminal coupled to node 282 which in turn is coupled to the base terminal of feedback transistor 88 and to output terminal 80. Node 282 is also coupled to the collector terminal of current source transistor 284, the base terminal of which is coupled to $V_R$ conductor 104, and the emitter terminal of which is coupled through resistor 286 to power supply conductor 60. Follower transistor 280 serves to shift the voltage established at node 78 more negative by one emitter-base junction voltage within the feedback path and establishes a low impedance source of the output signal at output terminal 80. Current source transistor 284 provides drive current to maintain follower transistor 280 conductive.

Reference voltages $V_C$, $V_1$ and $V_2$ shown within FIG. 5 have the same relationship to one another as within the latch circuit shown in FIG. 3. Furthermore, the voltage drop developed across load resistor 82 by the temperature proportional gate current sourced from the collector terminal of transistor 100 is again approximately 300 millivolts. In addition, since the load for the high fan-out latch circuit shown in FIG. 5 does not include an emitter-base junction, the previously described offset due to variations in the emitter-base junction voltage no longer exists. Accordingly, emitter 74 and emitter 92 of bias transistor 76 may be of the same size as the emitter of transistor 70 and emitter 90 of feedback transistor 88.

As in the case of the latch circuit described with reference to FIG. 3, the temperature proportional current within the gate shown in FIG. 5 assures that the voltage swing developed across load resistor 82 increases proportionally with temperature; also, the previously described bias circuitry assures that bias voltage $V_1$ is maintained within the midpoint of the output voltage swing provided at output terminal 80. Accordingly, the voltage differential established between the base terminals of bias transistor 76 and feedback transistor 88 increases proportionally with temperature to ensure that the desired ratio of on-current to off-current within transistors 76 and 88 is maintained over the entire temperature range.

Still referring to FIG. 5, an alternate embodiment of the present invention is illustrated wherein current steering transistors 96 and 98 are driven differentially rather than single-endedly. In this alternate embodiment, the base terminal of transistor 96 is coupled to a terminal 106', as indicated by the dashed lines within FIG. 5, rather than to bias voltage $V_2$, for receiving a $\overline{\text{CLOCK}}$ signal that is the complement of the CLOCK signal provided to terminal 106.

Those skilled in the art will now appreciate that an improved high speed latch circuit has been described which is compatible with processing methods used to manufacture high speed monolithic digital-to-analog converters while utilizing a relatively small number of components. The ability to use a relatively small voltage swing within the feedback portion of the latch circuit significantly reduces the possibility of degraded switching speeds due to saturation at high temperatures. The reduced voltage swing also results in faster switching times at nominal temperatures. Nonetheless, the characteristics of the described latch circuit over changes in temperature assure that an adequate on-current to off-current ratio is maintained within each emitter coupled transistor switch to provide adequate noise immunity. The ability to provide an output signal swing of an increased magnitude merely by inserting an additional load resistor within the collector of the load transistor allows the latch circuit to conveniently drive other types of switching circuits without risking saturation within the latch circuitry itself. Furthermore, the ability to select the voltage levels and corresponding temperature coefficients for the switching threshold levels over a wide range allows the input terminals of the described latch circuit to be directly interfaced with a wide variety of logic gates. While the present invention has been described with reference to preferred embodiments thereof, the description is for illustrative purposes only and is not to be construed as limiting the scope of the invention. Various modifications and changes may be made by those skilled in the art without departing from the true spirit and scope of the invention as defined by the appended claims.

We claim:

1. A latch circuit for receiving a binary data signal and selectively storing the received binary data signal, comprising in combination:
   a. bias transistor means having at least a collector terminal, a base terminal, and first and second emitter terminals;
   b. a first power supply conductor for conducting a first power supply voltage;
   c. an input transistor having emitter, base, and collector terminals, the collector terminal of said input transistor being coupled to said first power supply conductor, the emitter terminal of said input transistor being coupled to the first emitter terminal of said bias transistor means;
   d. input means for providing the binary data signal to the base terminal of said input transistor;
   e. a feedback transistor having emitter, base, and collector terminals, the emitter terminal of said feedback transistor being coupled to the second emitter terminal of said bias transistor means, the base terminal of said feedback transistor being coupled to the collector terminal of said bias transistor means, the collector terminal of said feedback transistor being coupled to said first power supply conductor;
   f. a second power supply conductor for conducting a second power supply voltage;
   g. a gate current source coupled to said second power supply conductor and having an output terminal for providing a regulated gate current having a magnitude substantially proportional to the temperature of said latch circuit;
   h. Current steering means having first, second and third current conducting terminals, said first and second current conducting terminals being coupled to the first and second emitter terminals, respectively, of said bias transistor means, said third current conducting terminal being coupled to the output terminal of said gate current source for receiving said regulated gate current, said current steering means including a control means for receiving control signal and being responsive to said control signal for selectively conducting said regulated gate current to said first or second current conducting terminal;
   i. a bias circuit coupled between said first and second power supply conductors and having a first reference terminal for providing a first reference voltage to the base terminal of said bias transistor means and having a second reference terminal for providing a second reference voltage; and j. load means including a first resistor coupled between the second reference terminal of said bias circuit and the collector terminal of said bias transistor means for generating a first output signal at the collector terminal of said bias transistor means, said first resistor selectively conducting said regulated gate current for causing said first output signal to have an associated voltage signal swing substantially proportional to temperature.

2. A latch circuit as recited by claim 1 wherein said load means incudes a semiconductor P-N junction, and wherein said first resistor and said semiconductor P-N junction are coupled in series between the second reference terminal of said bias circuit and the collector terminal of said bias transistor means for selectively conducting said regulated gate current to generate said first output signal at the collector terminal of said bias transistor means.

3. A latch circuit as recited in claim 2 wherein said bias transistor means includes first and second emitter regions coupled to said first and second emitter terminals, respectively, and wherein said input transistor and said feedback transistor each include emitter regions coupled to their respective emitter terminals, the first and second emitter regions of said bias transistor means each forming an emitter-base junction area substantially larger than the corresponding emitter-base junction area formed by each of the emitter regions of said input transistor and said feedback transistor to compensate for variations in the voltage across said semiconductor P-N junction caused by said bias transistor means being switched between conductive and nonconductive states.

4. A latch circuit as recited in claim 1 wherein said load means includes a load transistor having emitter, base and collector terminals, the emitter terminal of said load transistor being coupled to said first resistor and the base terminal of said load transistor being coupled to the second reference terminal of said bias circuit, said first resistor and the emitter-base junction of said load transistor being coupled in series between the collector terminal of said bias transistor means and the second reference terminal of said bias circuit, said load means further including a second resistor coupled between the collector terminal of said load transistor and said first power supply conductor, said second resistor generating a second output signal at the collector of said load transistor.

5. A latch circuit as recited by claim 4 wherein said second resistor within said load means is larger in magnitude than said first resistor for causing the signal swing associated with said second output signal to be larger than the signal swing associated with said first output signal.

6. A latch circuit as recited in claim 1 wherein said bias circuit includes a bias resistor and a semiconductor P-N junction coupled in series between said first reference terminal and said second reference terminal, said bias circuit also including means for coupling said second reference terminal to said first power supply conductor and a bias circuit current source coupled between said second power supply conductor and said series-coupled semiconductor P-N junction and bias resistor of said bias circuit, said bias circuit current source causing a regulated bias current to flow through said series-coupled semiconductor P-N junction and bias resistor of said bias circuit, the regulated bias current having a magnitude substantially proportional to the temperature of said latch circuit.

7. A latch circuit as recited in claim 6 wherein the regulated bias current is equal to the regulated gate current, and wherein said bias resistor has a magnitude of approximately one-half that of said first resistor within said load means.

8. A latch circuit as recited by claim 1 wherein said first reference voltage provided by said bias circuit is substantially near the midpoint between the first and second power supply voltages for enabling said latch circuit to be compatible with a binary data signal having high and low logic levels approximated by the first and second power supply voltages, respectively.

9. A latch circuit as recited by claim 1 wherein said input means comprises:
a. a buffer transistor having at least emitter and base terminals, the base terminal of said buffer transistor receiving the binary data signal; and
b. coupling means for coupling the emitter terminal of said buffer transistor to the base terminal of said input transistor.

10. A latch circuit as recited in claim 1 including a follower transistor for coupling the base terminal of said feedback transistor to the collector terminal of said bias transistor means, said follower transistor having at least emitter and base terminals, the base terminal of said follower transistor being coupled to the collector terminal of said bias transistor means, and the emitter terminal of said follower transistor being coupled to the base terminal of said feedback transistor, said follower transistor providing at its emitter terminal a low impedance, level-shifted output signal derived from said first output signal.

11. A latch circuit as recited in claim 1 wherein:
a. the control signal received by said control means is a differential control signal; and
b. said current steering means includes first and second current steering transistors each having emitter, base, and collector terminals, the emitter terminals of said first and second current steering transistors each being coupled to said third current conducting terminal, the collector terminals of said first and second current steering transistors being coupled to said first and second current conducting terminals, respectively, said control means being coupled to the base terminals of said first and second current steering transistors for providing the differential control signal to selectively switch said regulated gate current through one of said first and second current steering transistors.

12. A latch circuit as recited in claim 1 wherein:
a. said bias circuit provides a third reference voltage; and
b. said current steering means includes first and second current steering transistors each having emitter, base, and collector terminals, the emitter terminals of said first and second current steering transistors each being coupled to said third current conducting terminal, the collector terminals of said first and second current steering transistors being coupled to said first and second current conducting terminals, respectively, said control means being coupled to the base terminal of one of said first and second current steering transistors, the base terminal of the other of said first and second current steering transistors being coupled to said bias circuit for receiving the third reference voltage against which said control signal is compared for selectively switching said regulated gate current through one of said first and second current steering transistors.

* * * * *